(12) United States Patent
Kao et al.

(10) Patent No.: US 10,955,713 B2
(45) Date of Patent: Mar. 23, 2021

(54) DISPLAY DEVICE HAVING AN ELECTROSTATIC PROTECTING COMPONENT OVERLAPPED BY A SHIELDING LAYER

(71) Applicant: InnoLux Corporation, Miao-Li County (TW)

(72) Inventors: Chen-Kuan Kao, Miao-Li County (TW); Ching-Che Yang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/253,189

(22) Filed: Jan. 21, 2019

(65) Prior Publication Data
US 2019/0285953 A1    Sep. 19, 2019

(30) Foreign Application Priority Data
Mar. 14, 2018 (CN) .......................... 201810210868.2

(51) Int. Cl.
| | |
|---|---|
| *H01L 27/02* | (2006.01) |
| *H01L 27/12* | (2006.01) |
| *H01L 29/78* | (2006.01) |
| *H01L 51/52* | (2006.01) |
| *G02F 1/1362* | (2006.01) |
| *H01L 29/786* | (2006.01) |

(52) U.S. Cl.
CPC .... *G02F 1/136204* (2013.01); *H01L 27/0255* (2013.01); *H01L 27/0292* (2013.01); *H01L 27/0296* (2013.01); *H01L 27/124* (2013.01); *H01L 27/1214* (2013.01); *H01L 29/78633* (2013.01); *H01L 51/5284* (2013.01)

(58) Field of Classification Search
CPC ............ H01L 27/0255; H01L 27/0292; H01L 27/0296; H01L 27/1214; H01L 27/124; H01L 29/78633; H01L 51/5284; G02F 1/136204
See application file for complete search history.

(56) References Cited

U.S. PATENT DOCUMENTS

| | | | | |
|---|---|---|---|---|
| 5,867,151 A * | 2/1999 | Nakai | ..................... | G06F 3/041 345/173 |
| 6,404,475 B1 * | 6/2002 | Nakayoshi | ........ | G02F 1/134363 349/110 |
| 6,952,246 B2 * | 10/2005 | Matsumoto | ....... | G02F 1/136209 349/110 |
| 6,958,799 B2 * | 10/2005 | Tomioka | ........... | G02F 1/134363 349/106 |
| 7,973,863 B2 * | 7/2011 | Takama | .............. | G02F 1/13338 349/33 |
| 8,059,245 B2 * | 11/2011 | Iwakabe | ........... | G02F 1/134363 349/141 |

(Continued)

*Primary Examiner* — Ida M Soward
(74) *Attorney, Agent, or Firm* — Winston Hsu

(57) ABSTRACT

A display device includes a substrate, an electrostatic protecting component and a shielding layer. The substrate has a display region and a peripheral region located outside the display region. The electrostatic protecting component is disposed on the substrate in the peripheral region, and the electrostatic protecting component includes a semiconductor layer. The shielding layer is disposed on the substrate in the peripheral region, wherein the shielding layer overlaps the semiconductor layer.

14 Claims, 16 Drawing Sheets

(56) References Cited

U.S. PATENT DOCUMENTS

| | | | | |
|---|---|---|---|---|
| 8,460,953 B2* | 6/2013 | Tanaka | ............... | G02F 1/133512 |
| | | | | 257/E33.067 |
| 8,610,862 B2* | 12/2013 | Kimura | ................ | G02B 6/0055 |
| | | | | 349/141 |
| 9,823,502 B2* | 11/2017 | Alonso | ............. | G02F 1/133514 |
| 9,865,621 B2* | 1/2018 | Nakatani | ................ | G02F 1/1368 |
| 9,910,331 B2* | 3/2018 | Miyamoto | ........... | H01L 27/1251 |
| 9,915,848 B2* | 3/2018 | Kubota | ............... | H01L 27/1255 |
| 10,310,318 B2* | 6/2019 | Lu | ...................... | G02F 1/133512 |
| 10,416,805 B2* | 9/2019 | Yeh | ....................... | G06F 3/0412 |
| 10,423,021 B2* | 9/2019 | Kurasawa | .............. | G06F 3/0412 |
| 2006/0033872 A1* | 2/2006 | Sasuga | .............. | G02F 1/133308 |
| | | | | 349/149 |
| 2011/0088770 A1* | 4/2011 | Allemand | ........... | H01L 27/1421 |
| | | | | 136/256 |
| 2011/0183451 A1* | 7/2011 | Tanaka | .............. | G02F 1/133512 |
| | | | | 438/30 |
| 2017/0308211 A1* | 10/2017 | Adachi | ................... | G06F 3/044 |
| 2020/0019264 A1* | 1/2020 | Kadota | ................. | G06F 3/0412 |
| 2020/0251547 A1* | 8/2020 | Yamazaki | ........... | H01L 51/5246 |

\* cited by examiner

DISPLAY DEVICE HAVING AN ELECTROSTATIC PROTECTING COMPONENT OVERLAPPED BY A SHIELDING LAYER

CROSS REFERENCE TO RELATED APPLICATION

This application claims the priority benefit of China Patent Application Serial No. 201810210868.2, filed Mar. 14, 2018. The entirety of the above-mentioned patent application is hereby incorporated herein by reference.

BACKGROUND OF THE DISCLOSURE

1. Field of the Disclosure

The present disclosure relates to a display device and a manufacturing method thereof, and more particularly to a display device having a shielding layer configured to shield an electrostatic protecting component and a manufacturing method thereof.

2. Description of the Prior Art

A conventional display device is composed of two substrates with layers and various electronic components disposed between the substrates to display images. Since such a display device has the characteristics of thin appearance, low power consumption and no radiation pollution, it has been widely used in many kinds of portable or wearable electronic products, such as notebooks, smart phones, watches, and display devices in cars, for transmitting and displaying information more conveniently.

In the manufacturing process of some types of display devices, a polymerization reaction of liquid crystal mixture materials of the display device may be performed by irradiating light. For example, in a liquid crystal display (LCD) device, in order to provide the display with wide viewing angle, an alignment process for the liquid crystal molecules is performed by irradiating ultraviolet light (UV light) and providing the display device with power (e.g. voltage). However, some electronic components may be affected temporarily or permanently by the irradiated light during irradiation, e.g. a resistance of a transistor may be affected, such that when performing a process which needs irradiating the light and providing the power (such as the liquid crystal alignment process), the provided voltage (e.g. aligning voltage) may be influenced by irradiating the light, so as to make the alignment result worse and decrease the display quality and the yield of the display device.

SUMMARY OF THE DISCLOSURE

According to an embodiment, the present disclosure provides a display device including a substrate, an electrostatic protecting component and a shielding layer. The substrate has a display region and a peripheral region located outside the display region. The electrostatic protecting component is disposed on the substrate in the peripheral region, and the electrostatic protecting component includes a semiconductor layer. The shielding layer is disposed on the substrate in the peripheral region, wherein the shielding layer overlaps the semiconductor layer.

According to another embodiment, the present disclosure provides a manufacturing method of a display device including following steps: providing an array substrate, wherein the array substrate includes a substrate, an electrostatic protecting component and a shielding layer, the substrate has a display region and a peripheral region located outside the display region, the electrostatic protecting component is disposed on the substrate in the peripheral region, the electrostatic protecting component includes a semiconductor layer, the shielding layer is disposed on the substrate in the peripheral region, and the shielding layer overlaps the semiconductor layer; providing a liquid crystal layer and an opposite substrate on the array substrate, wherein the liquid crystal layer is disposed between the array substrate and the opposite substrate, and the liquid crystal layer includes a plurality of liquid crystal molecules and a plurality of the reactive monomers; and performing a first aligning process, wherein the first aligning process includes: applying a voltage to the array substrate to make the liquid crystal molecules of the liquid crystal layer have a pre-tilt angle; and irradiating the liquid crystal layer with light for aligning while applying the voltage, so that reaction of at least a portion of the reactive monomers is generated to fix the pre-tilt angle of the liquid crystal molecules, wherein the shielding layer blocks the light.

These and other objectives of the present disclosure will no doubt become obvious to those of ordinary skill in the art after reading the following detailed description of the embodiment that is illustrated in the various figures and drawings.

DETAILED DESCRIPTION

Figure 1:
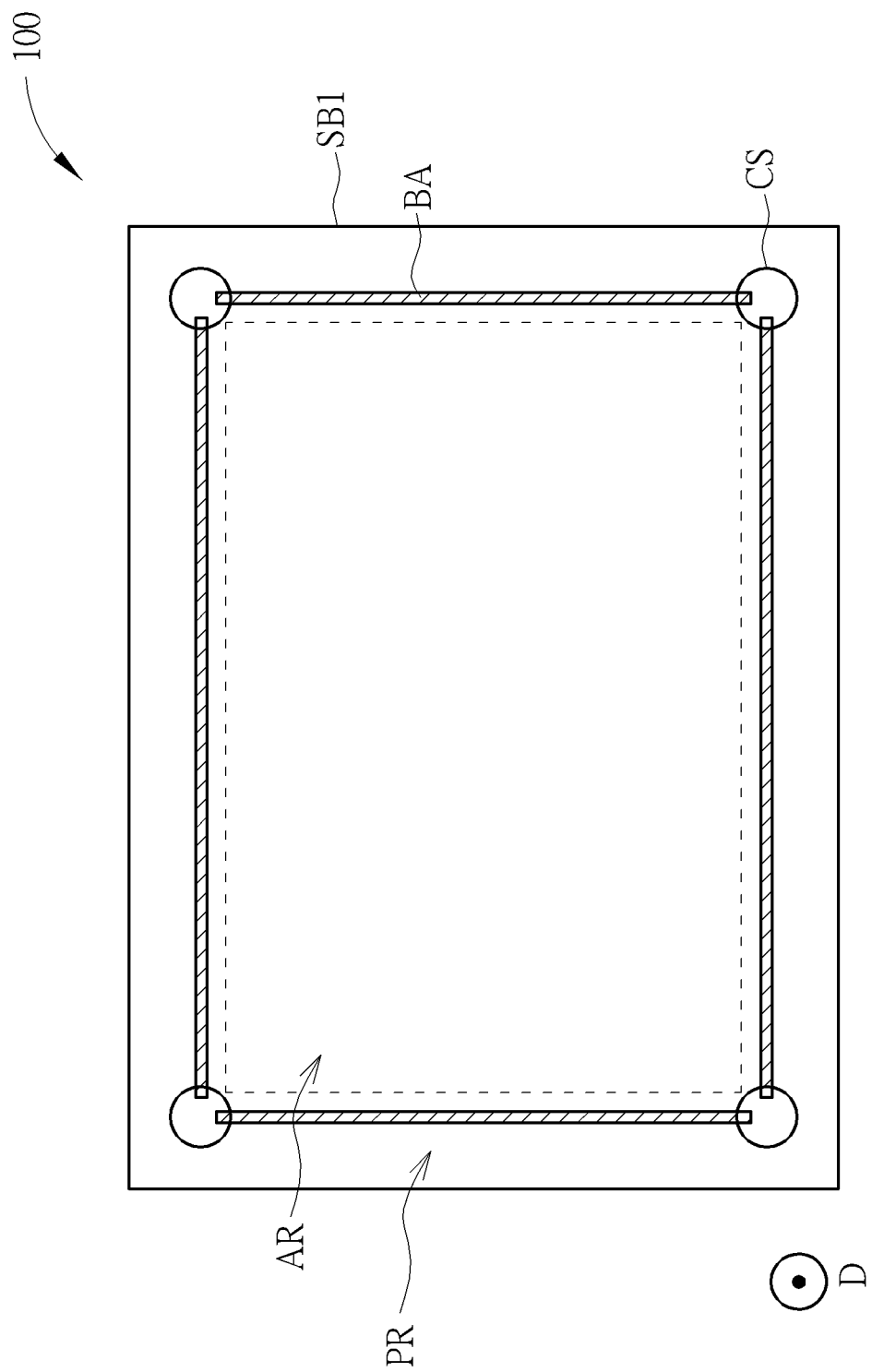
FIG. 1 is a top-view schematic diagram showing a display device according to an embodiment of the present disclosure.

To provide a better understanding of the present disclosure to the skilled users in the technology of the present disclosure, embodiments will be detailed as follows. The embodiments of the present disclosure are illustrated in the accompanying drawings with numbered elements to elaborate on the contents and effects to be achieved. It is needed to note that the drawings are simplified schematic, and therefore, the drawings show only the components and combinations associated with the present disclosure, so as to provide a clearer description of the basic architecture or method of implementation of the present disclosure. The components would be complex in reality. In addition, in order to explain, the components shown in the drawings of the present disclosure are not drawn to the actual number, shape, and dimensions, and the detail can be adjusted according to the design requirements.

When the terms "include", "comprise" and/or "have" are used in the description of the present disclosure, it indicates that the existence of the corresponding features, areas/regions, steps, operations and/or components, without excluding the existence or addition of one or a plurality of other features, areas/regions, steps, operations and/or components. When the corresponding component such as layer or area/region is referred to "on another component (or the variant thereof)" or "extend to another component", it may be disposed directly on another component or directly extend to another component, or other component may exist therebetween, such that the corresponding component and the another component may be or be not in contact with each other directly. On the other hand, when the component is referred to be "directly on another component (or the variant thereof)" or "directly extend to another component", there is no other component existing therebetween. In addition, when the component is referred to "be electrically connected to another component (or the variant thereof)", it may be directly connected to another component, or may be indirectly connected to another component through other component or components.

Figure 2:
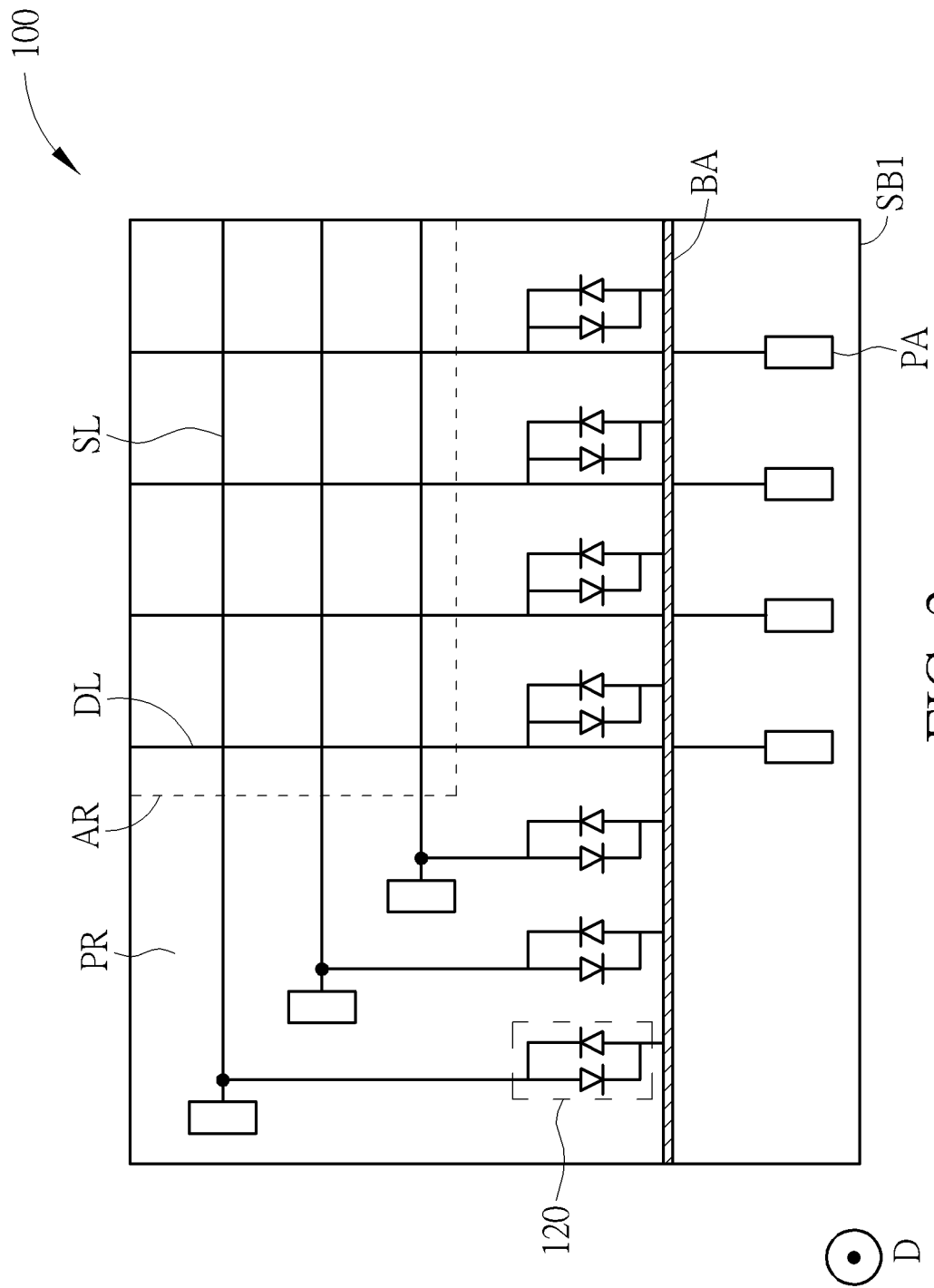
FIG. 2 is a top-view schematic diagram showing a portion of the display device according to the embodiment of the present disclosure.
Figure 3A:
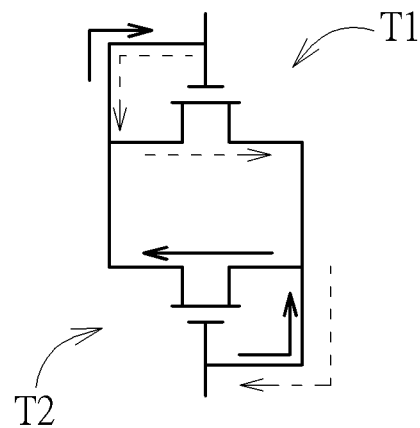
FIG. 3A is a circuit diagram showing the electrostatic protecting component according to a first embodiment of the present disclosure.
Figure 3B:
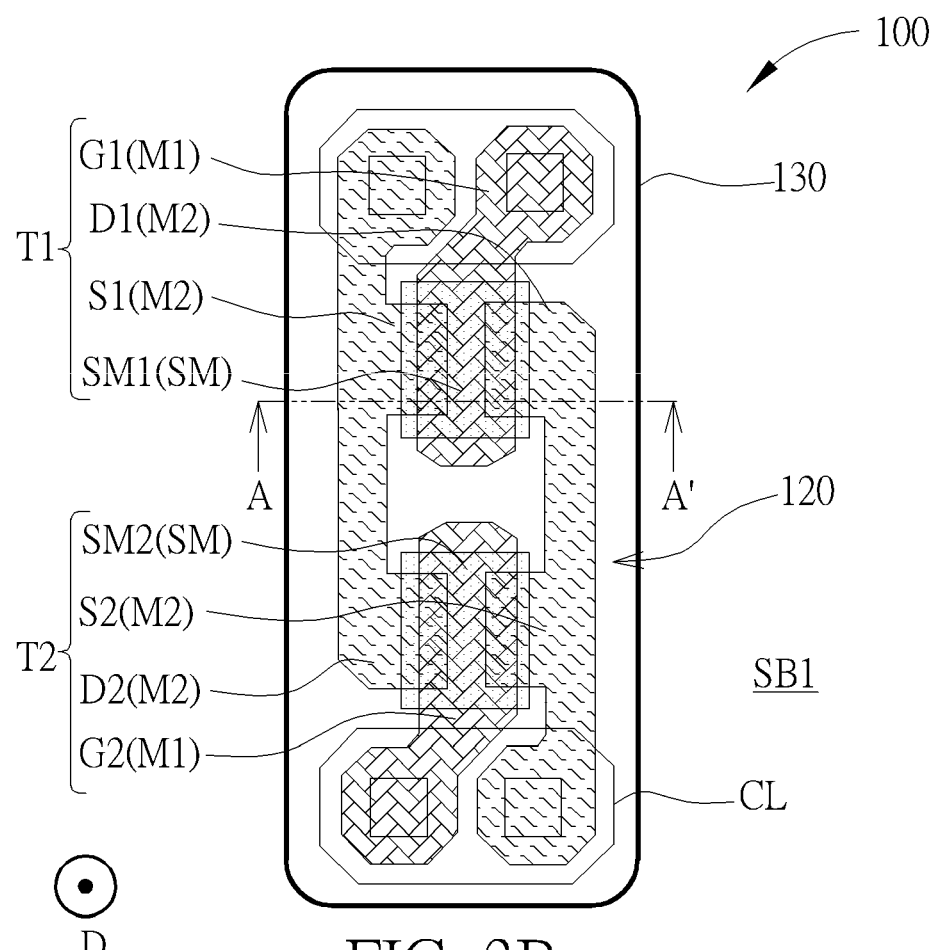
FIG. 3B is a top-view schematic diagram showing the electrostatic protecting component and the shielding layer according to the first embodiment of the present disclosure.
Figure 4:
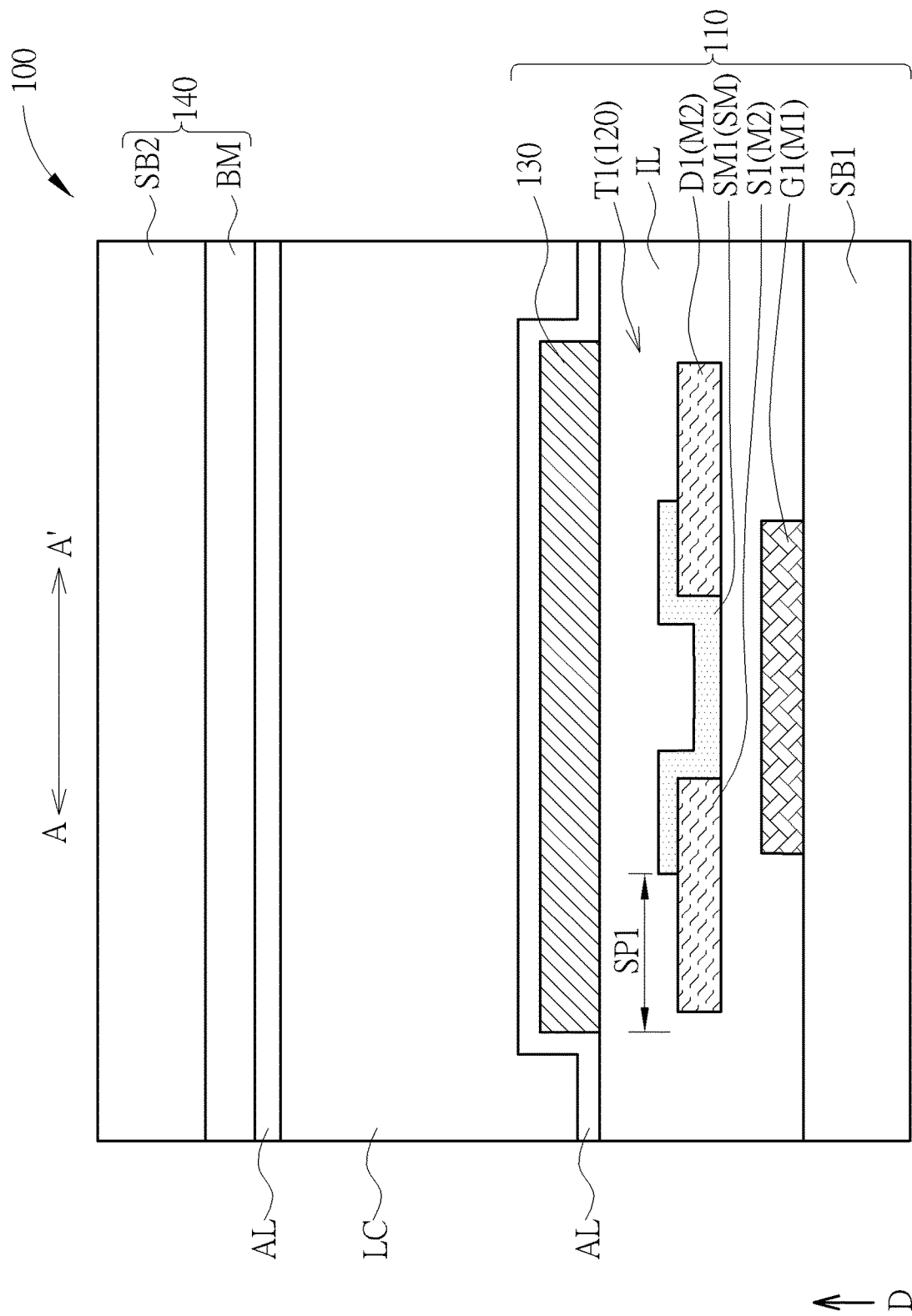
FIG. 4 is a cross-sectional-view schematic diagram taken along cross-sectional line A-A' in FIG. 3B.
Figure 5:
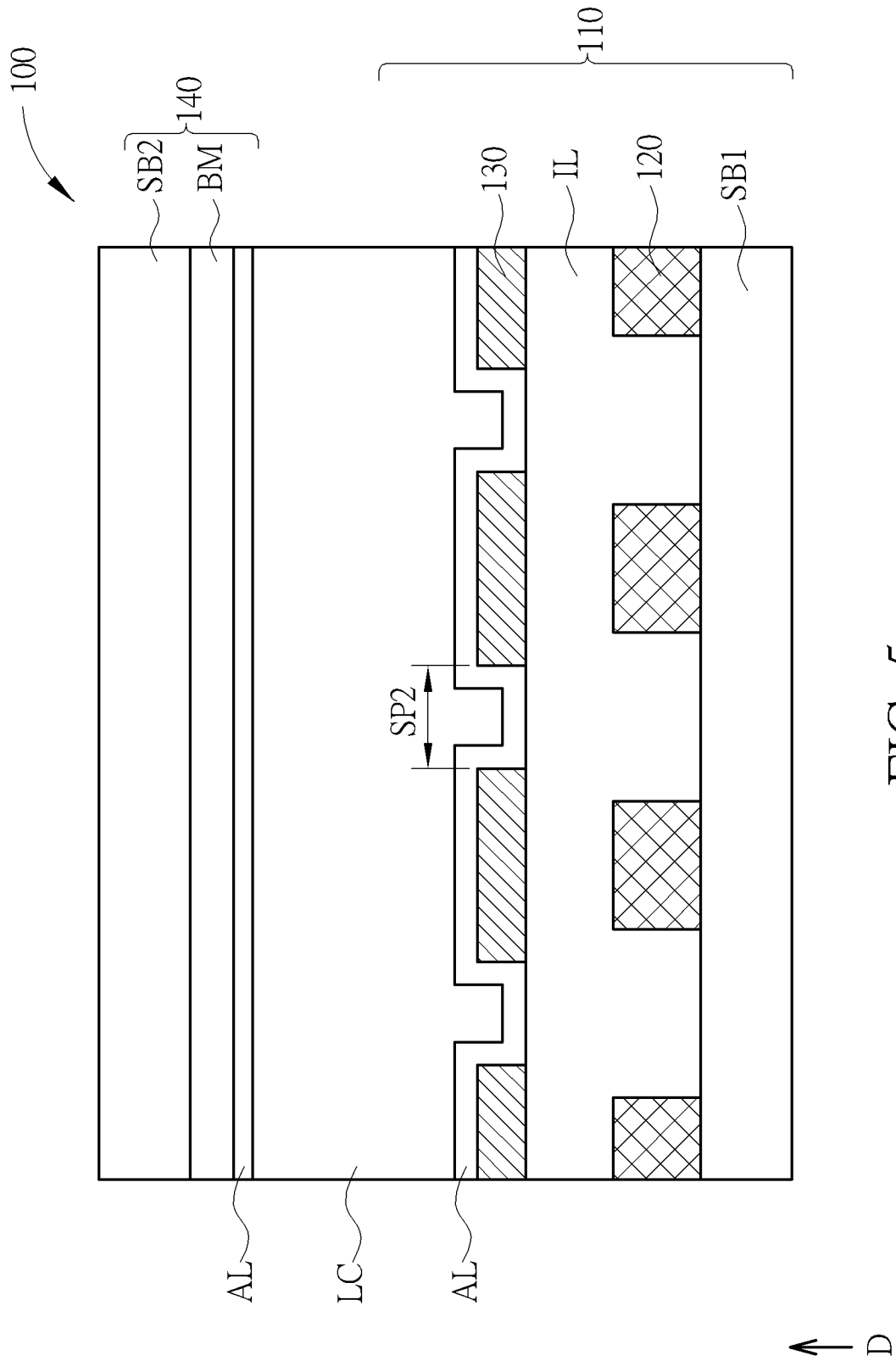
FIG. 5 is a cross-sectional-view schematic diagram showing the display device according to an embodiment of the present disclosure.

Referring to FIG. 1 to FIG. 5, FIG. 1 is a top-view schematic diagram showing a display device according to an embodiment of the present disclosure, FIG. 2 is a top-view schematic diagram showing a portion of the display device according to the embodiment of the present disclosure, FIG. 3A is a circuit diagram showing the electrostatic protecting component according to a first embodiment of the present disclosure, FIG. 3B is a top-view schematic diagram showing the electrostatic protecting component and the shielding layer according to the first embodiment of the present disclosure, FIG. 4 is a cross-sectional-view schematic diagram taken along cross-sectional line A-A' in FIG. 3B, and FIG. 5 is a cross-sectional-view schematic diagram showing the display device according to an embodiment of the present disclosure, in which FIG. 2 shows electronic components and structures adjacent to a corner of the display region AR in FIG. 1, FIG. 3A and FIG. 3B show one electrostatic protecting component in FIG. 2, and FIG. 5 shows a plurality of the electrostatic protecting components in FIG. 2. The display device described herein is a liquid crystal display (LCD) for example, but the display device of the present disclosure is not limited thereto. The disclosed display device can be implemented as various displays, such as those including organic light-emitting diodes (OLEDs), quantum dots (QDs), fluorescence molecules, phosphors, light-emitting diodes (LEDs), or micro light-emitting diodes (micro LEDs) as the display medium. The disclosed display device can also be implemented as a touch-controlled display with a touchscreen or liquid crystal antenna. Besides, the disclosed display device can be implemented as a flat, curved, or flexible display with or without a touchscreen. As shown in FIG. 1 to FIG. 5, the display device 100 of this embodiment includes an array substrate 110, and the display device 100 may selectively include an opposite substrate 140, a liquid crystal layer LC and two alignment layers AL. The array substrate 110 includes a first substrate SB1 configured to support electronic components, circuits or layers. The first substrate SB1 has a display region AR and a peripheral region PR located outside the display region AR. Some of the electronic components and the layers configured to display images, such as pixel electrodes, transistors, scan lines and data lines, are disposed on the first substrate SB1 in the display region AR, and some of the electronic components, such as driving circuits configured to drive the electronic components in the display region AR (e.g. integrated gate driver (IGD)), bonding pads, integrated circuits and traces, are disposed on the first substrate SB1 in the peripheral region PR, but the present disclosure is not limited thereto. It is noted that, in order to make the figures clear, FIG. 1 illustrates a scope of the display region AR instead of showing the components in the display region AR and omits the components in the peripheral region PR, and the data lines DL and the scan lines SL are shown in the display region AR in FIG. 2, but the present disclosure is not limited thereto. In this embodiment, the peripheral region PR surrounds the display region AR, but the present disclosure is not limited thereto. In a variant embodiment, the peripheral region PR may be disposed at at least one side of the display region AR. In this embodiment, the opposite substrate 140 is opposite to the array substrate 110, and includes a second substrate SB2 shown in FIG. 4. The liquid crystal layer LC is disposed between the array substrate 110 and the opposite substrate 140, and includes a plurality of liquid crystal molecules LCM (not show). The alignment layers AL are disposed between the array substrate 110 and the opposite substrate 140 for aligning the liquid crystal molecules LCM, in which the alignment layers AL may be formed of reactive monomers RM (not show). For example, the liquid crystal layer LC may selectively include the reactive monomers RM, and the reaction of the reactive monomers RM may be generated in an aligning process of a manufacturing process of the display device 100 so as to form the alignment layers AL, but the forming method of the alignment layers AL is not limited thereto. It is noted that, if the reaction of the reactive monomers RM of the liquid crystal layer LC is complete, the liquid crystal layer LC may not have the remaining reactive monomers RM when the manufacture of the display device 100 is completed. The alignment layers AL of this embodiment may respectively disposed between the liquid crystal layer LC and the first substrate SB1 and between the liquid crystal layer LC and the second substrate SB2, but the present disclosure is not limited thereto. In this embodiment, the alignment layers AL may be formed through irradiating the reactive monomers RM with light; that is to say, the reactive monomers RM of this embodiment may have a light reactivity, and the light irradiating the reactive monomers RM may be ultraviolet light (UV light) for example, but the present disclosure is not limited thereto. Moreover, the first substrate SB1 and the second substrate SB2 may be a rigid substrate, such as a glass substrate, a plastic substrate, a quartz substrate or a sapphire substrate, or a flexible substrate including polyimide (PI) or polyethylene terephthalate (PET), but the present disclosure is not limited thereto. Although a shape of the display device 100 of the above embodiment shown in the figures is a rectangle, the shape of the display device 100 is not limited thereto. The shape of the display device 100 may be a triangle, a rhombus, a trapezoid, a wedge, a suitable polygon or a suitable irregular shape with a curved edge.

As shown in FIG. 1 to FIG. 4, in the present disclosure, the array substrate 110 of the display device 100 includes at least one electrostatic protecting component 120 and the shielding layer 130 for providing the display device 100 with an electrostatic protection. The electrostatic protecting component 120 is disposed on the first substrate SB1 in the peripheral region PR. The electrostatic protecting component 120 may be coupled with the electronic component disposed on the first substrate SB1, in which this electronic component may be disposed in the display region AR or the peripheral region PR. For instance, as shown in FIG. 2, the electrostatic protecting component 120 may be coupled with one of the data lines DL or one of the scan lines SL in the display region AR, and the data lines DL and the scan lines SL in FIG. 2 are coupled with bonding pads PA for being connected to the corresponding circuit, but the present disclosure is not limited thereto. In this embodiment, the electrostatic protecting component 120 may include a back-to-back diode for example, and the back-to-back diode may be formed of a first transistor T1 and a second transistor T2 in FIG. 3A to FIG. 3B. In detail, the array substrate 110 may further include a first metal layer M1, an insulating layer IL, a second metal layer M2 and a semiconductor layer SM. In this embodiment, the first metal layer M1 is disposed on the first substrate SB1, the insulating layer IL is disposed on the first metal layer M1 and the first substrate SB1, the second metal layer M2 is disposed on the first metal layer M1 and disposed in the insulating layer IL, and the semiconductor layer SM is disposed on the second metal layer M2 and disposed in the insulating layer IL. The semiconductor layer SM includes a first semiconductor layer SM1 and a second semiconductor layer SM2, and the first semiconductor layer SM1 is electrically insulated from the second semiconductor layer SM2 in FIG. 3B. The first gate G1 of the first transistor T1 and the second gate G2 of the second transistor T2 are formed of the first metal layer M1; that is to say, the first metal layer M1 has a gate electrode including the first gate G1 and the second gate G2, and the first gate G1 and the second gate G2 are disposed between the first substrate SB1 and the semiconductor layer SM. When the first gate G1 doesn't receive excessive negative electrostatic charges or the second gate G2 doesn't receive excessive positive electrostatic charges, the first gate G1 and the second gate G2 may electrically insulated from each other. The first gate G1 is electrically connected to the first semiconductor layer SM1, and the second gate G2 is electrically connected to the second semiconductor layer SM2. A first source S1 and a first drain D1 of the first transistor T1 and a second source S2 and a second drain D2 of the second transistor T2 are formed of the second metal layer M2; that is to say, the second metal layer M2 has a source electrode including the first source S1 and the second source S2 and a drain electrode including the first drain D1 and the second drain D2. Therefore, the first transistor T1 and the second transistor T2 are bottom-gate transistors, but the present disclosure is not limited thereto. In FIG. 3A and FIG. 3B, the first source S1, the first semiconductor layer SM1, the first gate G1 and the second drain D2 of this embodiment are electrically connected to each other, and the second source S2, the second semiconductor layer SM2, the second gate G2 and the first drain D1 are electrically connected to each other, so as to form the back-to-back diode, but the connection in the back-to-back diode is not limited thereto. The electrostatic protecting component 120 may include other component with the electrostatic protection function. The semiconductor layer SM may include metal oxide, amorphous silicon or polysilicon for instance. In addition, the array substrate 110 may optionally further include other conductive layer, insulating layer and/or required layer. For example, as shown in FIG. 3B, the array substrate 110 further includes two conductive layers CL, each of the conductive layers CL may be a metal conductive layer, a transparent conductive layer or other suitable conductive layer, and the conductive layers CL are configured to respectively electrically connect the first gate G1 of the first transistor T1 to the first source S1 of the first transistor T1 and electrically connect the second gate G2 of the second transistor T2 to the second source S2 of the second transistor T2. In another embodiment, a resistance of the electrostatic protecting component 120 may be greater than or equal to 1MΩ (Ohm); for instance, the resistance of the electrostatic protecting component 120 may range from 1MΩ, in which 1MΩ is equal to 1000000Ω, but the resistance of the electrostatic protecting component 120 is not limited thereto.

Moreover, in FIG. 1 and FIG. 2, the array substrate 110 may selectively include at least one short bar BA disposed on the first substrate SB1 in the peripheral region PR, and the short bar BA is coupled with the electrostatic protecting component 120, such that electrostatic charges may be discharged to a component provided with common voltage (e.g. a common electrode) through the electrostatic protecting component 120. In this embodiment, the array substrate 110 has four short bars BA respectively disposed at four outsides of the display region AR, and the short bars BA are electrically connected to each other through conductive structure CS. Thus, as shown in FIG. 2 and FIG. 3, in the process of the electrostatic protection of the electrostatic protecting component 120, if the first gate G1 receives excessive negative electrostatic charges or the second gate G2 receives excessive positive electrostatic charges, the second transistor T2 of the electrostatic protecting component 120 may be turned on, such that a current indicated as the solid arrow in FIG. 3A is generated; if the first gate G1 receives excessive positive electrostatic charges or the second gate receives G2 excessive negative electrostatic charges, the first transistor T1 of the electrostatic protecting component 120 may be turned on, such that a current indicated as the dashed arrow in FIG. 3A is generated. Therefore, the electrostatic charges may be conducted to the short bar BA to be discharged. Furthermore, the short bar BA may be formed of a transparent conductive layer for example, but the present disclosure is not limited thereto.

As shown in FIG. 1 to FIG. 4, the shielding layer 130 is disposed on the first substrate SB1 in the peripheral region PR, and overlaps at least a portion of the electrostatic protecting component 120 in a projecting direction (top view direction) D. In this embodiment, the shielding layer 130 is disposed on the electrostatic protecting component 120, and may be a patterned layer, but the present disclosure is not limited thereto. In the present disclosure, the shielding layer 130 may block the aligning light (e.g. the light configured to form the alignment layers AL), so as to reduce the influence of the light on the electrostatic protecting component 120. It is noted that, "a layer blocks specific light" described herein means that this layer may prevent the specific light from transmission or reduce the transmittance of the specific light. The shielding layer 130 may have the function for absorbing, reflecting or scattering the specific light. The shielding layer 130 may include at least one of a spacer material, a photoresist material, an organic material and a metal material, or include other suitable material. The shielding layer 130 may be a single-layer structure or a multi-layer structure. In this embodiment, the shielding layer 130 may be a single-layer structure. The spacer material may include a photo-spacer resist (PS) material or a black photo-spacer resist (BPS) material. The photoresist material may include a color photoresist material or other photoresist, in which the color photoresist material may include at least one of a red photoresist material and a green photoresist material for example, and the metal material may include chromium for example, but the present disclosure is not limited thereto.

In this embodiment, a wavelength of the aligning light may range from 254 nm (nanometer) to 400 nm, which is the UV light, and thus, the shielding layer 130 may include a material capable of absorbing, reflecting or scattering light with a wavelength ranging from 254 nm to 400 nm, such that the shielding layer 130 has a transmittance less than or equal to 80% when the light has the wavelength ranging from 254 nm to 400 nm. Moreover, the shielding layer 130 may also allow the transmission of light with the wavelength outside the above wavelength range, but the present disclosure is not limited thereto. In addition, in order to gain a good light blocking function, a thickness of the shielding layer 130 may range from 0.1 μm (micrometer) to 10 μm. For instance, if the shielding layer 130 includes the photoresist material or the organic material, the thickness of the shielding layer 130 may range from about 1 μm to about 10 μm, or from about 1 μm to about 5 μm; and if the shielding layer 130 includes the metal material, the thickness of the shielding layer 130 may range from about 0.1 μm to about 1 μm, but the present disclosure is not limited thereto. The thickness of the shielding layer 130 may be designed based on a cell gap of the liquid crystal layer.

Generally, in the manufacturing method of the display device 100, the aligning process is performed after assembling the array substrate 110 and the opposite substrate 140. In the aligning process, the array substrate 110 and the opposite substrate 140 are applied with voltages respectively, for example, the electronic components of the array substrate 110 (e.g. the pixel electrode of the display region AR) and the common electrode of the opposite substrate 140 are respectively applied with the voltages, so as to make the liquid crystal molecules LCM tilt to a predetermined direction and have a pre-tilt angle. Then, the aligning light is irradiated onto the liquid crystal layer LC, such that the reactive monomers RM in the liquid crystal layer LC are polymerized on the surface of the array substrate 110 and the surface of the opposite substrate 140 to form the alignment layers AL. Accordingly, the liquid crystal molecules LCM may be fixed to have the predetermined pre-tilt angle and the predetermined orientation angle through the alignment layers AL, so as to gain the high contrast and the wide viewing angle. For instance, the liquid crystal molecules LCM may be aligned towards a plurality of directions to form a multi-domain alignment display device, such as a multi-domain vertical alignment (MVA) display device, but not limited thereto. However, in the conventional display device, because the conventional display device does not have the shielding layer 130 for shielding the electrostatic protecting component 120, when forming the alignment layer AL, the light is directly irradiated onto the electrostatic protecting component 120 or irradiated onto the electrostatic protecting component 120 by the reflection of another layer, such that an electrical characteristic of the electrostatic protecting component 120 may be affected temporarily or permanently. For instance, the resistance of the semiconductor layer of the electrostatic protecting component 120 may be changed owing to the irradiation of the light. Because the electrostatic protecting component 120 is electrically connected to the electronic components in the display region AR (the electronic components is for example the pixel electrodes, the transistors, the scan lines, the data lines, etc.), the voltages received by the electronic components in the display region AR may be influenced owing to the change to the electrical characteristic of the electrostatic protecting component 120 when performing the aligning process. Accordingly, the pre-tilt angles and the orientation angles of the liquid crystal molecules LCM may be greater or less, thereby affecting the display quality of the display device; for example, unevenness (mura) in brightness or hue is generated or the transmittance of the displaying light is reduced. In contrast, in the present disclosure, since the shielding layer 130 overlaps at least a portion of the electrostatic protecting component 120 in the projecting direction D of the first substrate SB1, and the shielding layer 130 has the function of blocking the aligning light, the influence of the light on the electrostatic protecting component 120 is decreased, so as to achieve the predetermined alignment and enhance the display quality of the display device 100. In this embodiment, because the electrostatic protecting component 120 includes the back-to-back diode having the semiconductor layer SM, the shielding layer 130 may at least shield (overlaps) the semiconductor layer SM of the electrostatic protecting component 120 in the projecting direction D for reducing the influence of the light on the semiconductor layer SM. In this embodiment, the shielding layer 130 totally shields the electrostatic protecting component 120; that is to say, the shielding layer 130 may simultaneously shield the first semiconductor layer SM1 and the second semiconductor layer SM2 separated from each other, but the present disclosure is not limited thereto. It is noted that, "a layer (or layers) shields a component in the projecting direction D" described herein means this component is disposed in a scope of this layer (these layers) in the projecting direction D. In addition, in order to enhance the shielding effect, the semiconductor layer SM of the electrostatic protecting component 120 may be disposed between the gate electrode (including the first gate G1 and the second gate G2) and the shielding layer 130 in a cross section view, and the gate, the source and the drain shield the semiconductor layer SM in the projecting direction D, such that one side of the semiconductor layer SM is shielded by the shielding layer 130, and the other side is shielded by the gate electrode, the source electrode and the drain electrode. In other words, in FIG. 4, the shielding layer 130 blocks the light irradiated from top to bottom, and the first gate G1, the first source S1 and the first drain D1 block the light irradiated from bottom to top, but the present disclosure is not limited thereto. In another embodiment, the source electrodes and the drain electrodes of the first transistor T1 and the second transistor T2 are disposed between the semiconductor layer SM and the shielding layer 130 in a cross section view, and therefore, one side of the semiconductor layer SM is shielded by the shielding layer 130 (the shielding layer 130 totally shields the semiconductor layer SM) or shielded by the shielding layer 130, the source electrode and the drain electrode (the shielding layer 130, the source electrode and the drain electrode respectively shield portions of the semiconductor layer SM), and the other side of the semiconductor layer SM is shielded by the gate electrode, in which the first semiconductor layer SM1 and the second semiconductor layer SM2 are respectively disposed in the scopes of the first gate G1 and the second gate G2 in the projecting direction D. Moreover, in this embodiment, a space SP1 existing between an edge of the shielding layer 130 and an edge of the semiconductor layer SM may be greater than or equal to 5 µm, so as to block the obliquely incident light and gain a better blocking effect.

On the other hand, as shown in FIG. 4 and FIG. 5, FIG. 4 is a cross-sectional-view schematic diagram taken along cross-sectional line A-A' in FIG. 3B, and FIG. 5 is a cross-sectional-view schematic diagram showing the display device according to an embodiment of the present disclosure. FIG. 3B show one electrostatic protecting component in FIG. 2, and FIG. 5 shows a plurality of the electrostatic protecting components in FIG. 2. In this embodiment, a color filter of the display device 100 may be disposed in the opposite substrate 140 for example. Because a red photoresist material and a green photoresist material in the color filter may block the UV light, the light for aligning may be emitted from an outer side of the array substrate 110 into the display device 100 in the aligning process; that is to say, in FIG. 4 and FIG. 5, the light for aligning is emitted from bottom to top and emitted into the display device 100. In order to have complete reaction of the monomer materials for aligning (such as the reactive monomers RM) in the liquid crystal layer LC in the peripheral region PR, a space SP2 between the shielding layers 130 of this embodiment is greater than or equal to 3 µm, such that the light may be irradiated onto the liquid crystal layer LC in the peripheral region PR through the space SP2 between the shielding layers 130. Each shielding layer 130 may overlap at least a portion of one electrostatic protecting component 120, but the present disclosure is not limited thereto. In addition, the display device 100 may further include other layers based on requirements. For instance, the opposite substrate 140 of the display device 100 may further include an Black Matrix BM configured to separate pixels from each other in the display region AR and to shield the structure in the peripheral region PR (e.g. circuit structure in the peripheral region PR), but the present disclosure is not limited thereto. In another embodiment, the Black Matrix BM may be disposed in the array substrate 110; in other words, the display device 100 may be a BOA (Black Matrix on array) type display device, and the opposite substrate 140 does not have the Black Matrix BM. Furthermore, the display device 100 may further include polarizer. Moreover, since the display device 100 of this embodiment may be the MVA display device, the display device 100 may be a vertical alignment type display device, but the present disclosure is not limited thereto.

In another embodiment, the color filter may be disposed in the array substrate 110; in other words, the display device 100 may be a COA (color filter on array) type display device, and the opposite substrate 140 does not have the color filter. Thus, the light configured to align may be emitted from an outer side of the opposite substrate 140 into the display device 100 (the light is emitted from top to bottom in FIG. 4) in the aligning process. In this condition, the shielding layer 130 of the array substrate 110 may block the light and prevent the light from influencing the electrical characteristic of the electrostatic protecting component 120. Moreover, if the shielding layer 130 includes the color photoresist material, and the display device 100 is the COA type display device, the color filter and the shielding layer 130 of the display device may be formed of the same layer, but the present disclosure is not limited thereto.

The display device of the present disclosure is not limited to the above embodiments. Further embodiments of the present disclosure are described below. For ease of comparison, same components will be labeled with the same symbol in the following. The following descriptions relate to the differences between the embodiments, and repeated parts will not be redundantly described.

Figure 6:
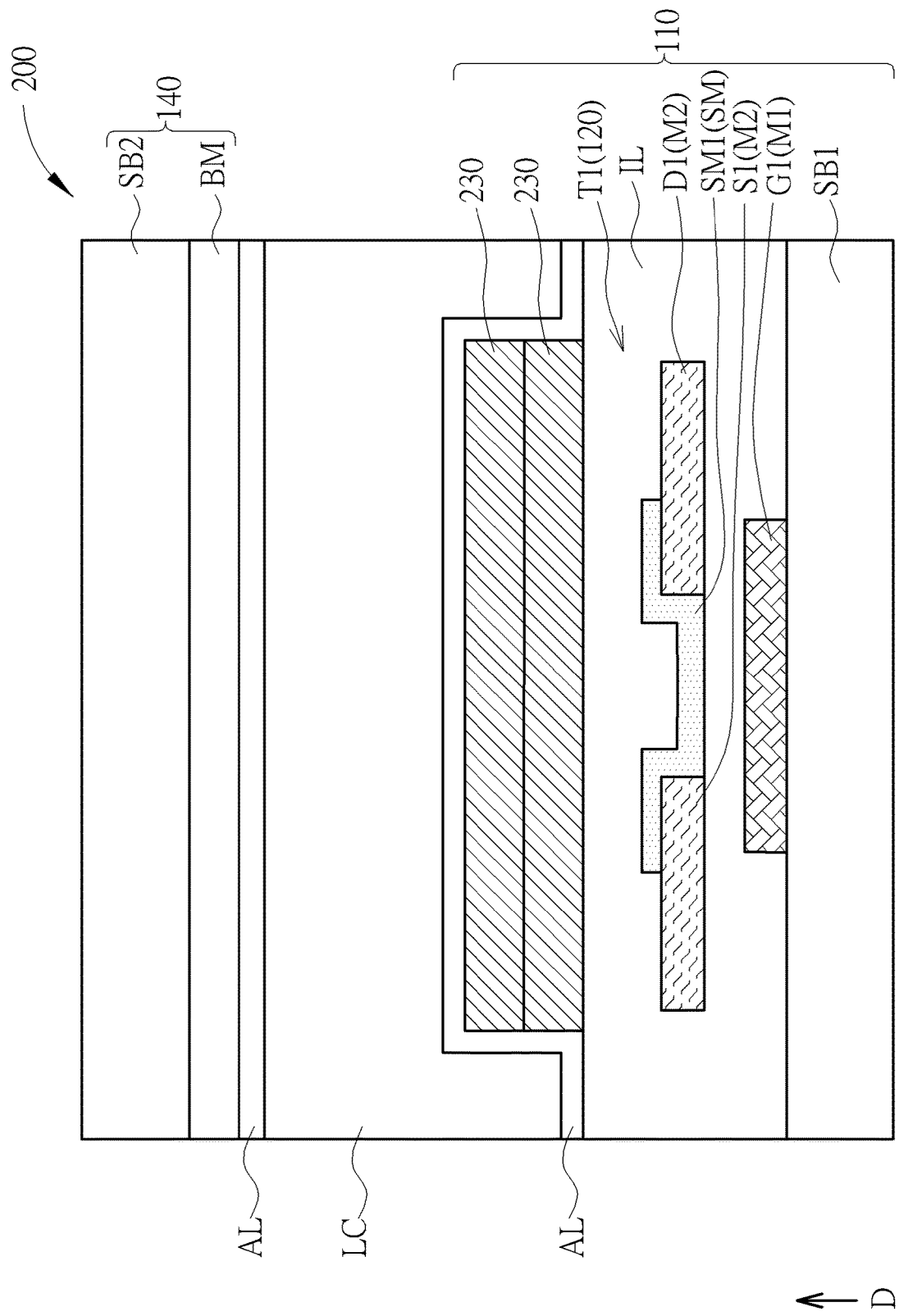
FIG. 6 is a cross-sectional-view schematic diagram showing the display device according to a second embodiment of the present disclosure.

Referring to FIG. 6, FIG. 6 is across-sectional-view schematic diagram showing the display device according to a second embodiment of the present disclosure. As shown in FIG. 6, compared with the first embodiment, the shielding layer 230 of the display device 200 of this embodiment is a multi-layer structure. For instance, if the shielding layer 230 includes the color photoresist material, one layer of the shielding layer 230 may include the red photoresist material, and another layer of the shielding layer 230 may include the green photoresist material. If the shielding layer 230 includes the metal material, one layer of the shielding layer 230 may be a metal layer (such as chromium), and another layer of the shielding layer 230 may be a metal oxide layer (such as chromium oxide), but the present disclosure is not limited thereto. In this embodiment, the shielding layer shown in FIG. 6 has two sub-layers, but not limited thereto. The shielding layer 230 which is the multi-layer structure may have two or more sub-layers.

Figure 7:
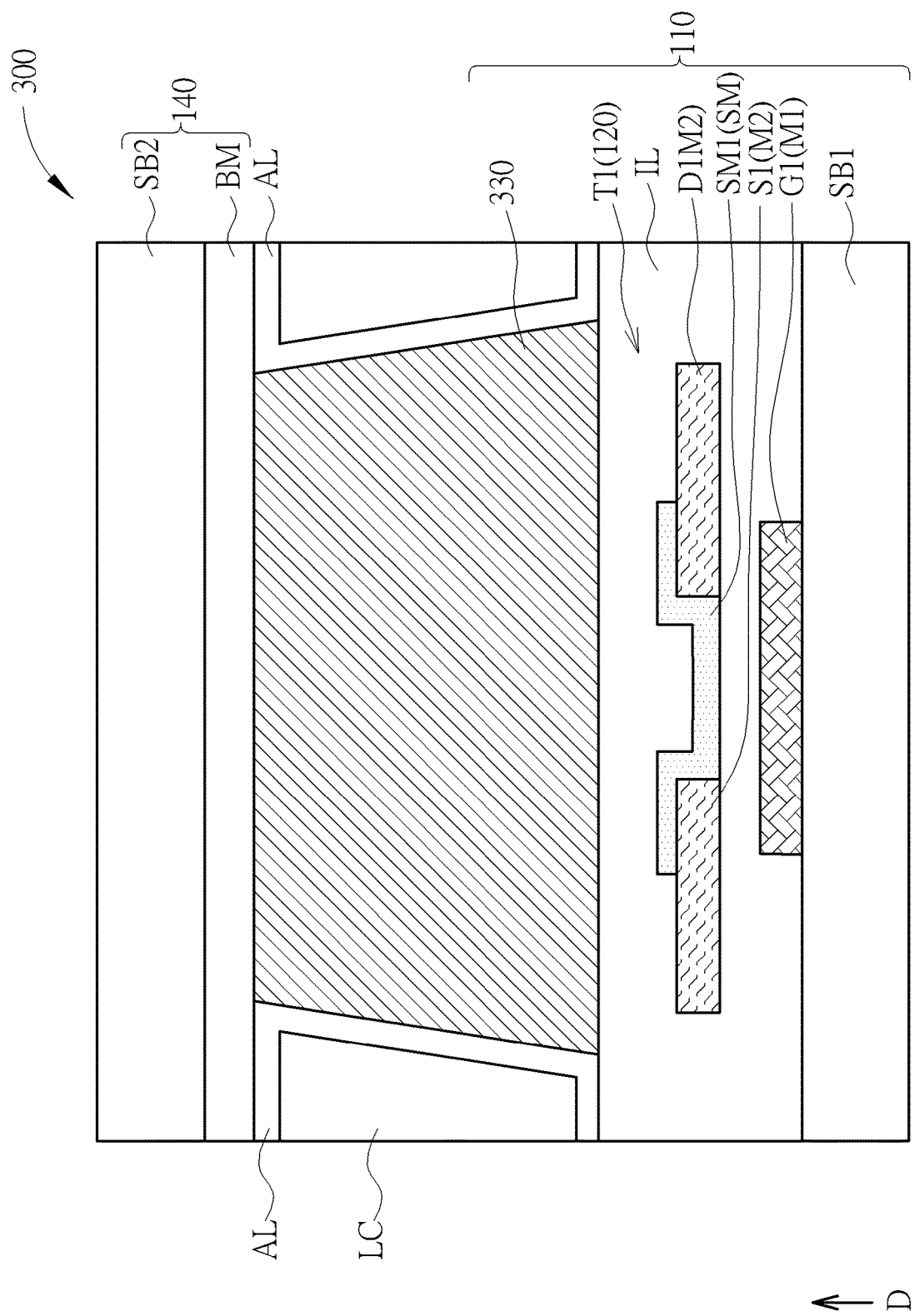
FIG. 7 is a cross-sectional-view schematic diagram showing the display device according to a third embodiment of the present disclosure.

Referring to FIG. 7, FIG. 7 is across-sectional-view schematic diagram showing the display device according to a third embodiment of the present disclosure. As shown in FIG. 7, compared with the first embodiment, the shielding layer 330 of the display device 300 of this embodiment may be in contact with the opposite substrate 140. For example, the shielding layer 330 may be a spacer configured to hold the space between the array substrate 110 and the opposite substrate 140 of the display device 300, so as to form the cell gap of the liquid crystal layer, but the present disclosure is not limited thereto. In addition, the spacer may be a circular column, a square column, a truncated cone or other suitable structure.

Figure 8:
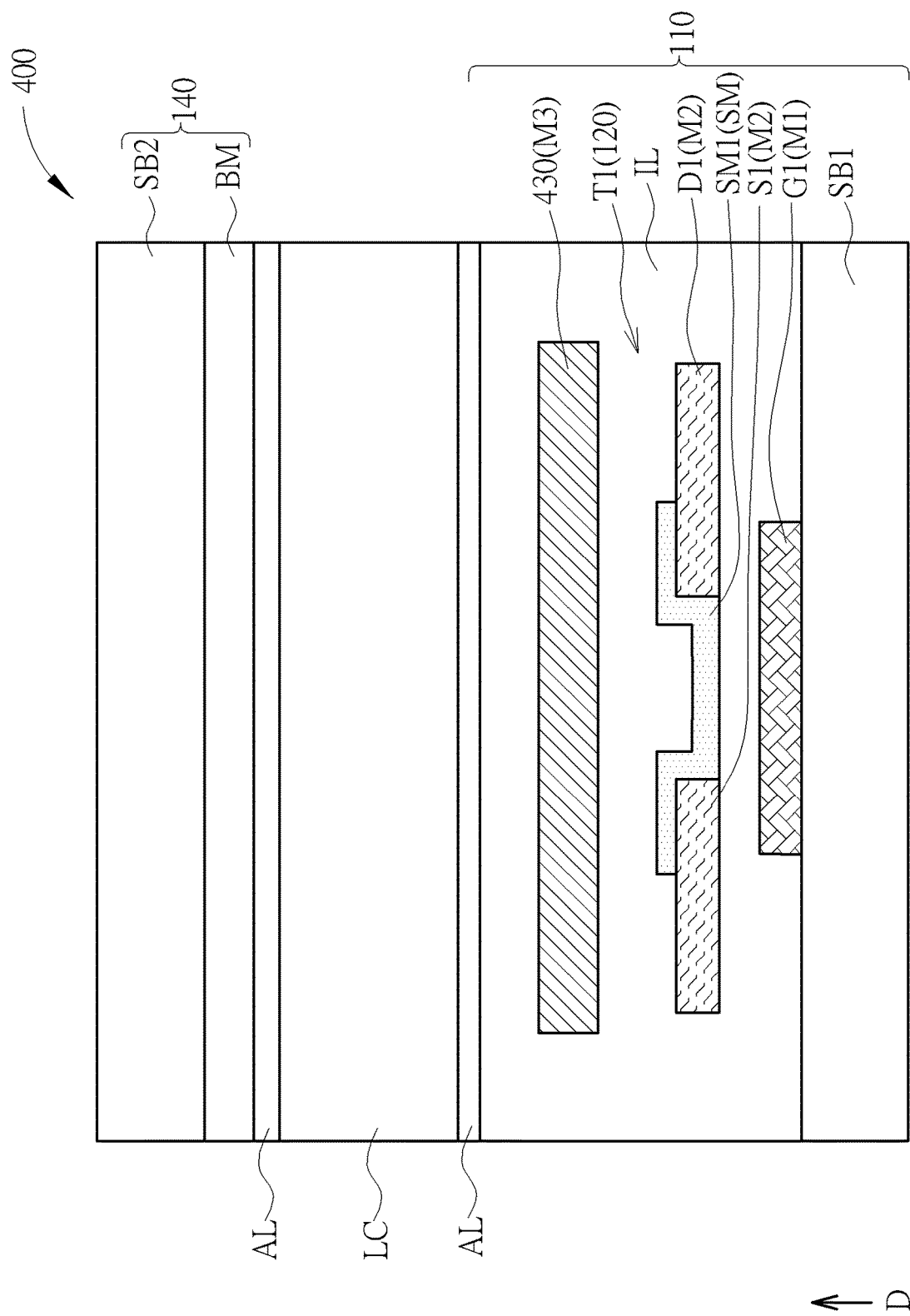
FIG. 8 is a cross-sectional-view schematic diagram showing the display device according to a fourth embodiment of the present disclosure.

Referring to FIG. 8, FIG. 8 is across-sectional-view schematic diagram showing the display device according to a fourth embodiment of the present disclosure. As shown in FIG. 8, compared with the first embodiment, the shielding layer 430 of the display device 400 of this embodiment is formed of a metal layer in the insulating layer IL. In FIG. 8, for instance, the shielding layer 430 may be formed of a third metal layer M3 disposed on the second metal layer M2 and the semiconductor layer SM. Moreover, in this embodiment, the shielding layer 430 is electrically insulated from the first metal layer M1 and the second metal layer M2. For example, the shielding layer 430 may be in a floating state, but the present disclosure is not limited thereto.

Figure 9:
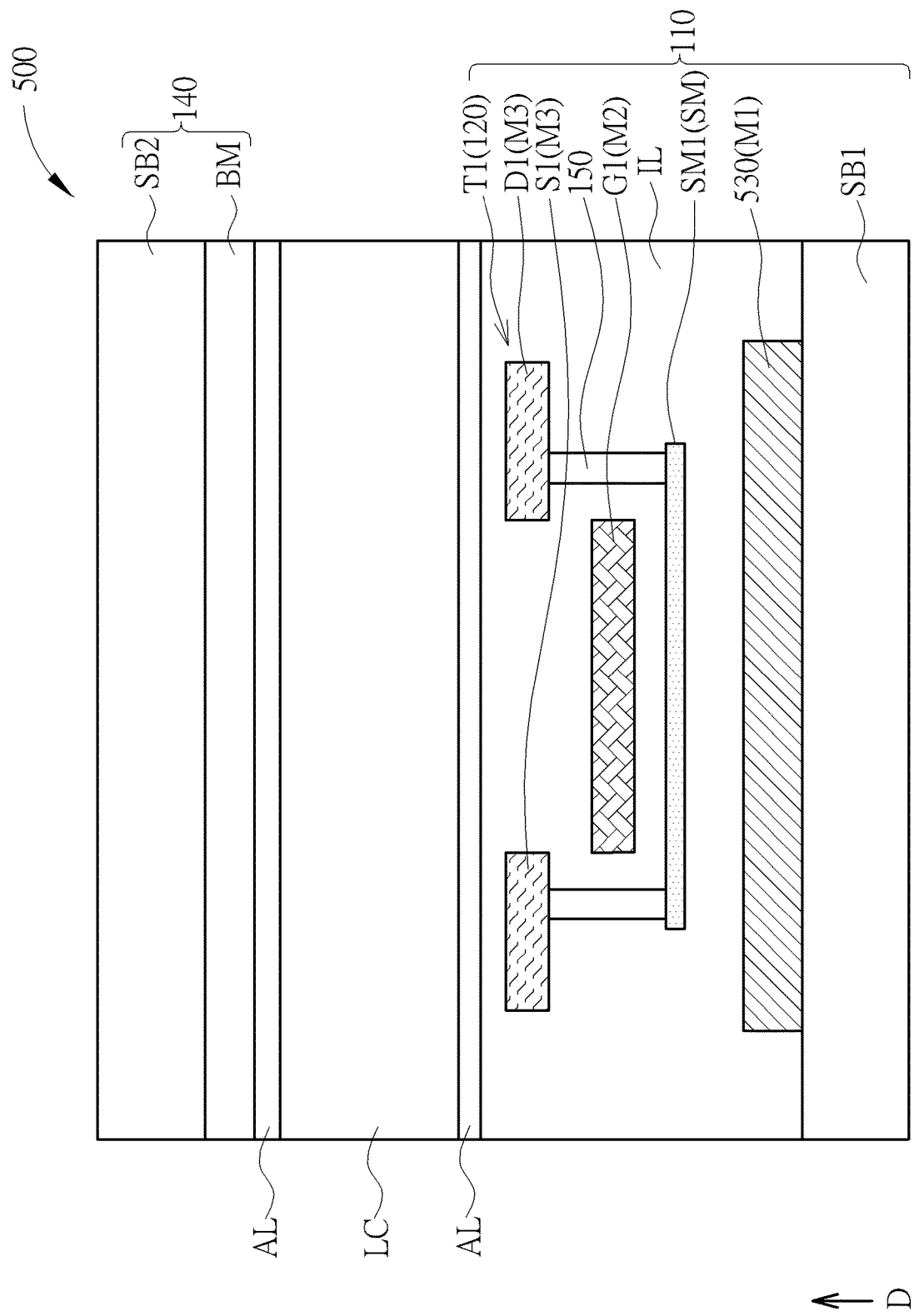
FIG. 9 is a cross-sectional-view schematic diagram showing the display device according to a fifth embodiment of the present disclosure.

Referring to FIG. 9, FIG. 9 is a cross-sectional-view schematic diagram showing the display device according to a fifth embodiment of the present disclosure. As shown in FIG. 9, compared with the first embodiment, the first transistor T1 and the second transistor T2 of the electrostatic protecting component 120 of the display device 500 of this embodiment may be top-gate transistors. The gate electrode including the first gate G1 and the second gate G2 and the semiconductor layer SM are disposed on the shielding layer 530, the shielding layer 530 is disposed between the gate electrode and the first substrate SB1, and the semiconductor layer SM is disposed between the gate electrode and the shielding layer 530. For instance, the shielding layer 530 may be formed of the first metal layer M1, the gate electrode may be formed of the second metal layer M2, the source electrode (including the first source S1 and the second source S2) and the drain electrode (including the first drain D1 and the second drain D2) may be formed of the third metal layer M3, and the gate electrode, the source electrode and the drain electrode are disposed on the semiconductor layer SM. The source electrode and the drain electrode are electrically connected to the semiconductor layer SM through via 150, and the shielding layer 530 is disposed between the first substrate SB1 and the semiconductor layer SM. Therefore, in FIG. 9, the shielding layer 530 may block the light from bottom to top, and the gate electrode, the source electrode and the drain electrode may block the light from top to bottom, but the present disclosure is not limited thereto. In this embodiment, the shielding layer 530 is electrically insulated from the semiconductor layer SM through the insulating layer IL. In another embodiment, the shielding layer 530 may be formed of the insulating material, such as at least one of the spacer material, the photoresist material and the organic material, or other suitable insulating material. In this condition, the shielding layer 530 may be or may not be in contact with the semiconductor layer SM.

Figure 10:
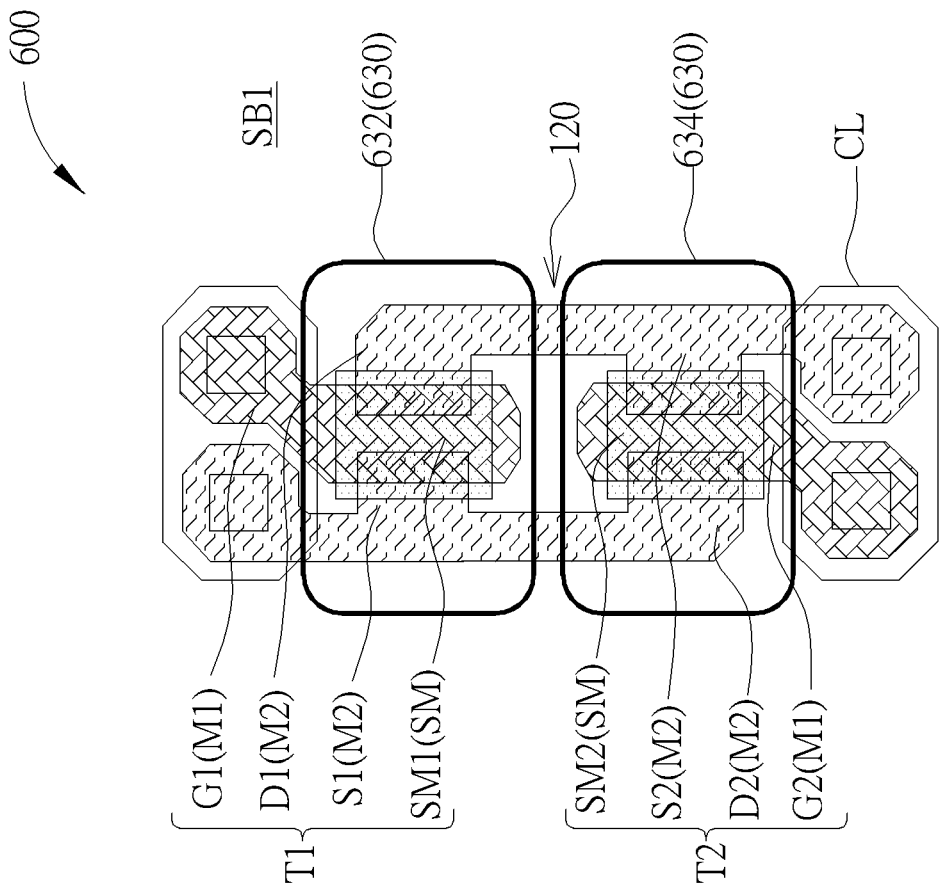
FIG. 10 is a top-view schematic diagram showing the electrostatic protecting component and the shielding layer according to a sixth embodiment of the present disclosure.

Referring to FIG. 10, FIG. 10 is a top-view schematic diagram showing the electrostatic protecting component and the shielding layer according to a sixth embodiment of the present disclosure. As shown in FIG. 10, compared with the first embodiment, the shielding layer 630 of the display device 600 of this embodiment includes a first shielding layer 632 and a second shielding layer 634, and the first shielding layer 632 and the second shielding layer 634 are separated from each other and respectively overlap different portions of the electrostatic protecting component 120 in the projecting direction D of the first substrate SB1. For example, the first shielding layer 632 overlaps the first semiconductor layer SM1, and the second shielding layer 634 overlaps the second semiconductor layer SM2, so as to respectively shield the different portions of the semiconductor layer SM, but the present disclosure is not limited thereto. Moreover, since the first shielding layer 632 and the second shielding layer 634 of the shielding layer 630 are separated from each other, such that the liquid crystal layer LC in the peripheral region PR may be irradiated by more light in the aligning process, so as to prevent the reactive monomers from being reacted incompletely.

Figure 11:
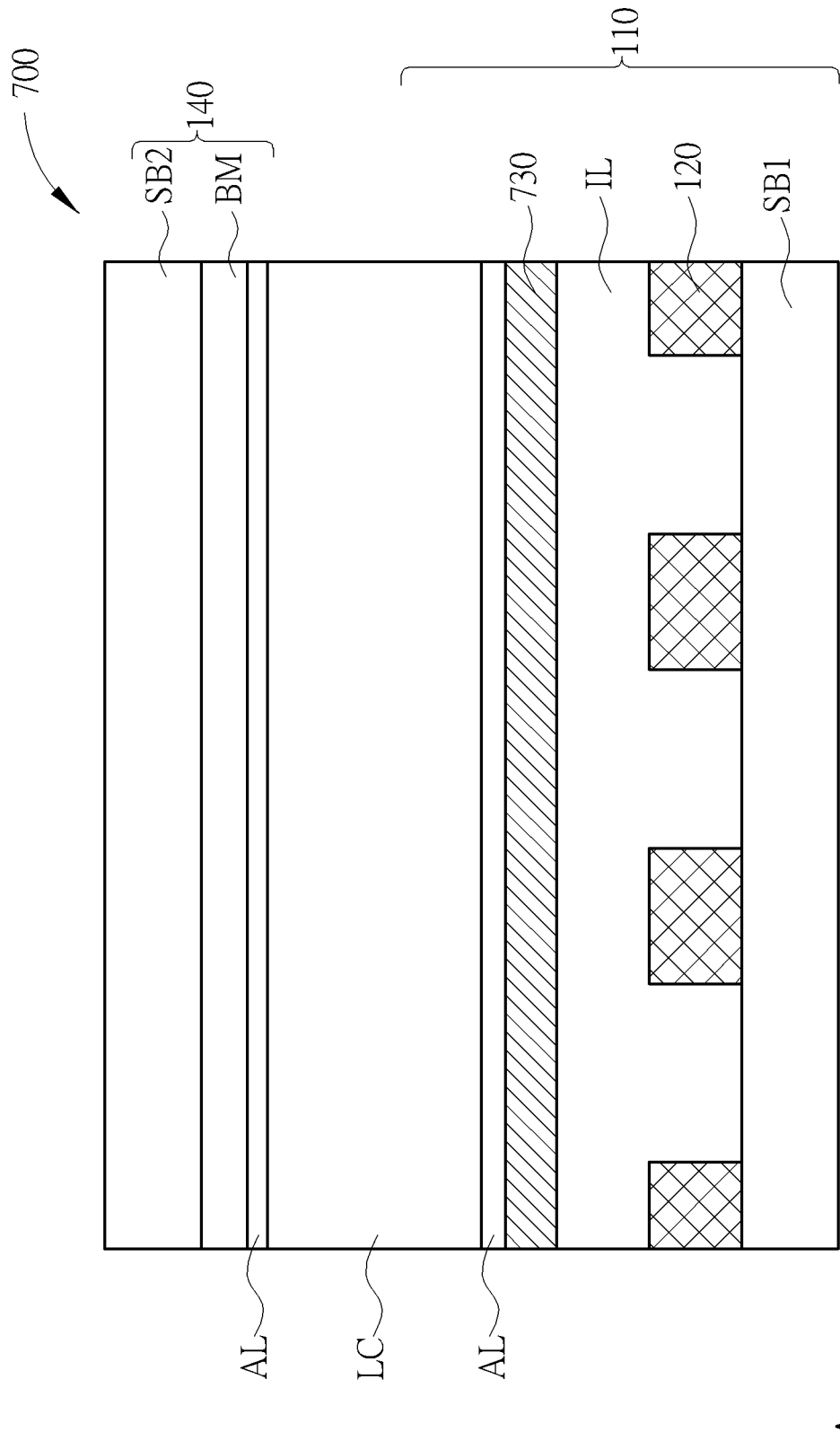
FIG. 11 is a cross-sectional-view schematic diagram showing the display device according to a seventh embodiment of the present disclosure.

Referring to FIG. 11, FIG. 11 is a cross-sectional-view schematic diagram showing the display device according to a seventh embodiment of the present disclosure, wherein FIG. 11 shows the cross-sectional-view schematic diagram of the electrostatic protecting components in FIG. 2. As shown in FIG. 11, compared with the first embodiment, the shielding layer 730 of the display device 700 of this embodiment may shield a plurality of electrostatic protecting components 120. If the color filter of the display device 700 is disposed in the opposite substrate 140; that is, if the light configured to align is emitted from the outer side of the array substrate 110 into the display device 700 (the light is emitted from bottom to top in FIG. 11) in the aligning process, a space existing between the shielding layer 730 of the display device 700 may be greater than or equal to 3 μm (similar to the space SP2 in FIG. 5, not show in FIG. 11), such that the light may be irradiated onto the liquid crystal layer LC in the peripheral region PR through the space between the shielding layers 730. In another embodiment, in the condition that the display device 700 is the COA type display device, the light configured to align is emitted from the outer side of the opposite substrate 140 into the display device 700 (the light is emitted from top to bottom in FIG. 11) in the aligning process, the light may be irradiated onto the liquid crystal molecules LCM in the peripheral region PR by reflection in the display device 700, such as the UV light entering the liquid crystal layer LC from the display region AR may be irradiated onto the liquid crystal layer LC in the peripheral region PR by reflection, and therefore, the reaction of the reactive monomers is not affected even if the shielding layer 730 shielding the plurality of the electrostatic protecting components 120 in the peripheral region PR does not have a hole or a space. For instance, one shielding layer 730 of this embodiment may shield all of the electrostatic protecting components 120, but the present disclosure is not limited thereto. In addition, if the shielding layer 730 includes the color photoresist material, and the display device 700 is the COA type display device, the color filter and the shielding layer 730 of the display device may be formed of the same layer, but the present disclosure is not limited thereto.

Figure 12:
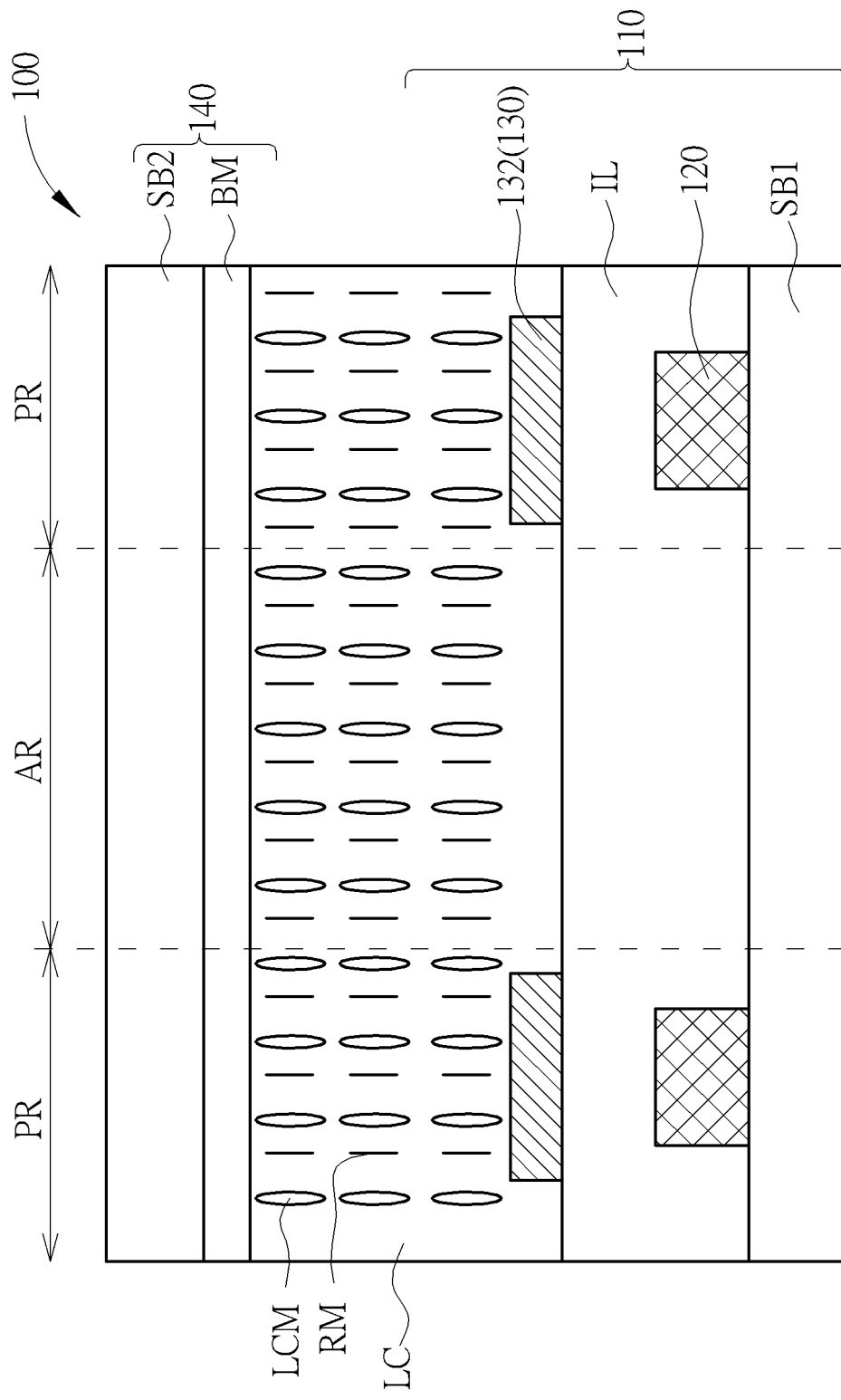
FIG. 12 to FIG. 15 are cross-sectional-view schematic diagrams showing a manufacturing method of the display device according to an embodiment of the present disclosure.
Figure 14:
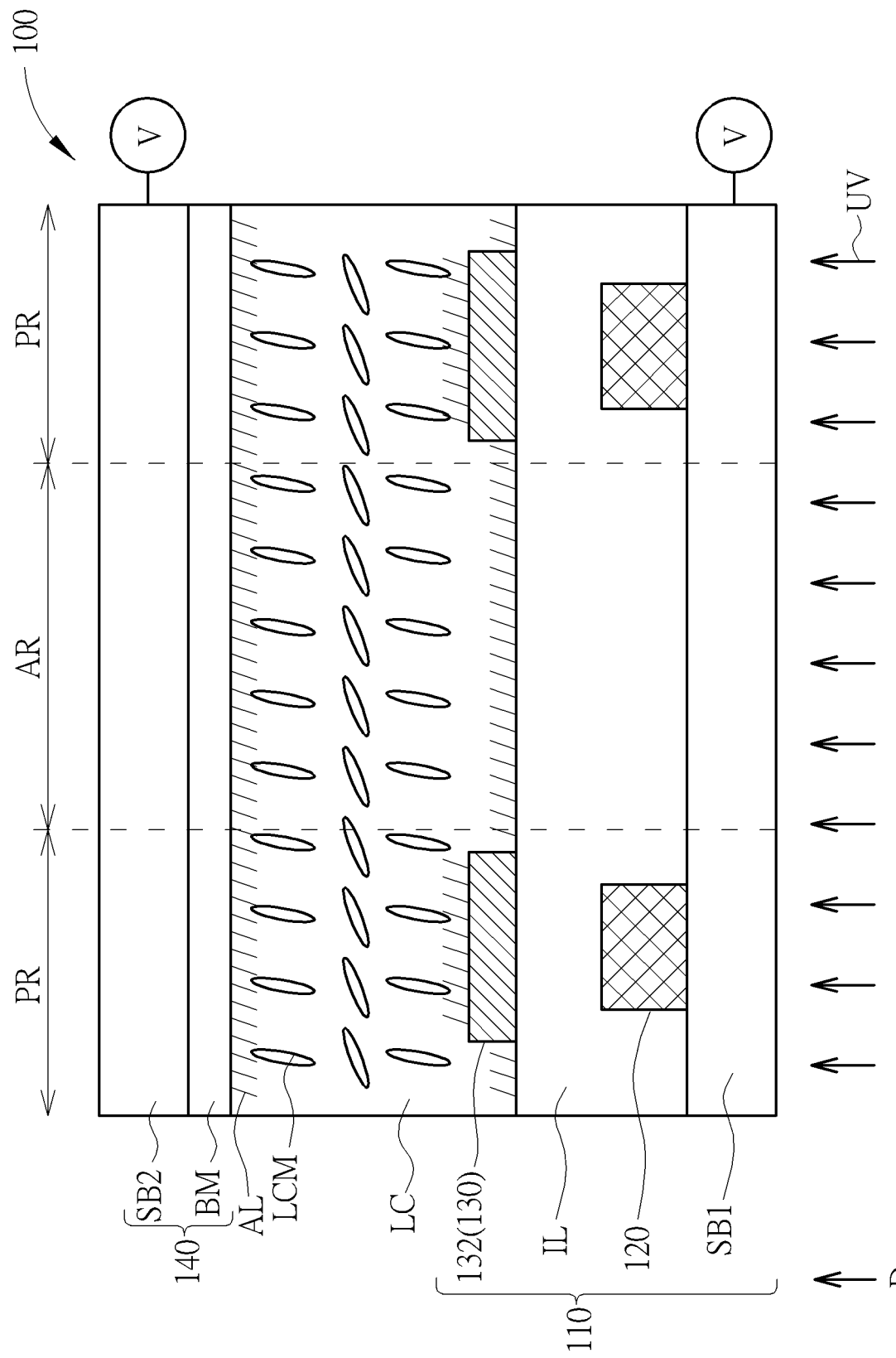
Figure 15:
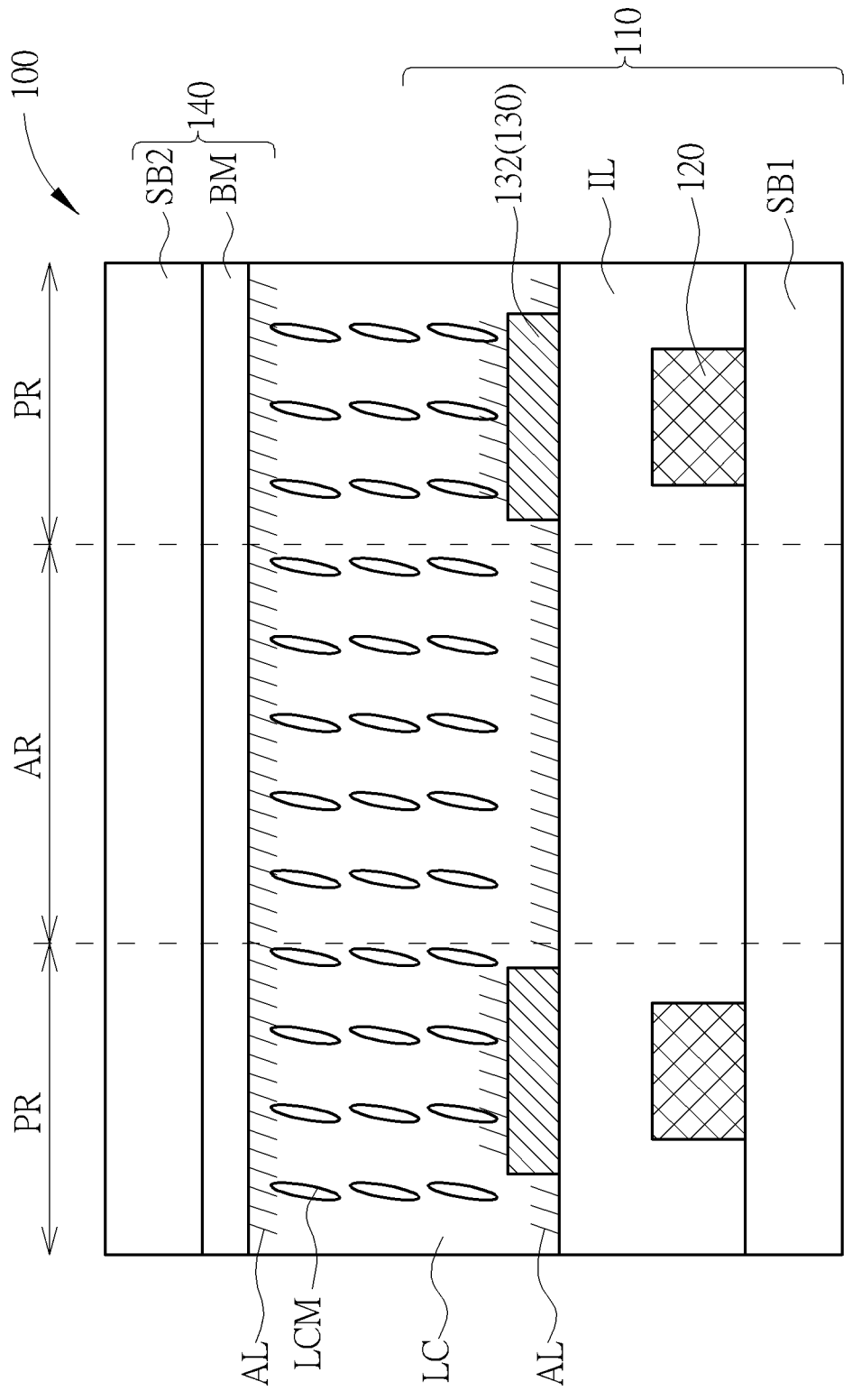
Figure 16:
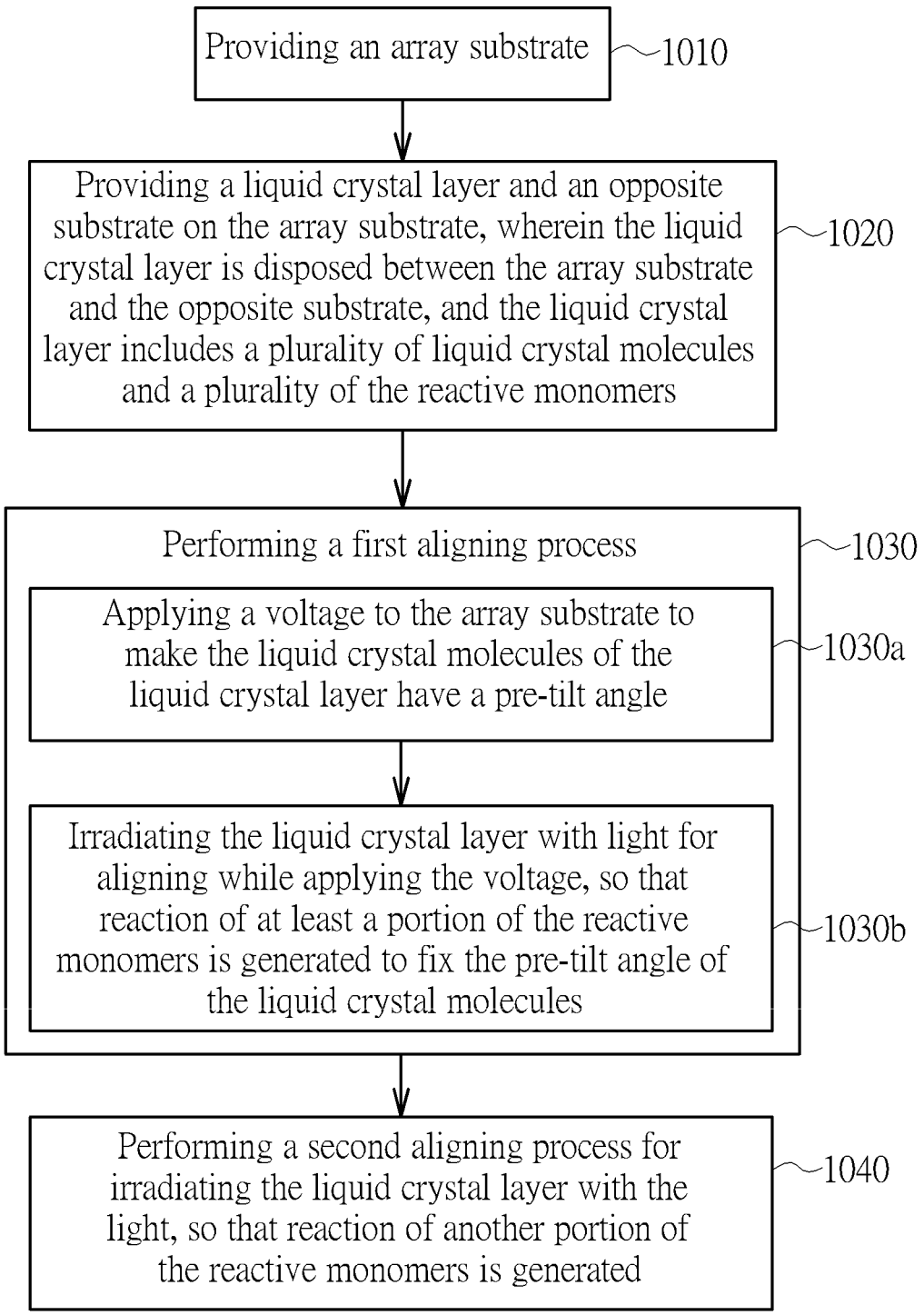
FIG. 16 is a schematic diagram showing a flow chart of the manufacturing method of the display device according to an embodiment of the present disclosure.

Referring to FIG. 12 to FIG. 16, FIG. 12 to FIG. 15 are cross-sectional-view schematic diagrams showing a manufacturing method of the display device according to an embodiment of the present disclosure, and FIG. 16 is a schematic diagram showing a flow chart of the manufacturing method of the display device according to an embodiment of the present disclosure, in which the display device 100 shown in FIG. 12 to FIG. 15 is the first embodiment of the present disclosure for example, and FIG. 12 to FIG. 15 omit some components in the display region AR of the display device 100. In the following, the display device 100 of the first embodiment is taken as an example to explain the manufacturing method of the display device. As shown in FIG. 12 and FIG. 16, the aforementioned array substrate 110 is provided (step 1010). Then, the liquid crystal layer LC and the opposite substrate 140 is formed (provided) on the array substrate 110, in which the liquid crystal layer LC is disposed between the array substrate 110 and the opposite substrate 140, and the liquid crystal layer LC includes the liquid crystal molecules LCM and the reactive monomers RM (step 1020). For instance, a liquid crystal dripping process may be performed on the array substrate 110, such that the liquid crystal molecules LCM and the reactive monomers RM are dispersed uniformly on the array substrate 110. Following that, the opposite substrate 140 is disposed on the array substrate 110, and the opposite substrate 140 and the array substrate 110 are assembled with each other, such that the liquid crystal layer LC is disposed between the opposite substrate 140 and the array substrate 110. Furthermore, before assembling the two substrates, a sealant (not show) may be formed on one of the opposite substrate 140 and the array substrate 110. Also, when assembling the two substrates, a vacuum pumping process may be performed between the two substrates and the sealant is adhered between the opposite substrate 140 and the array substrate 110, and then, a curing process is performed to heat the sealant and/or to irradiate the sealant by light (e.g. UV light) so as to complete the assembling process of the two substrates, but the forming method of the liquid crystal layer LC and the assembling process of the two substrates are not limited thereto. In addition, before assembling the two substrates, organic alignment material layers may be selectively formed on the surface of the array substrate 110 and the surface of the opposite substrate 140 respectively to advantage the aligning process of the liquid crystal molecules. The organic alignment material layers may include polyimide (PI) for example.

Figure 13:
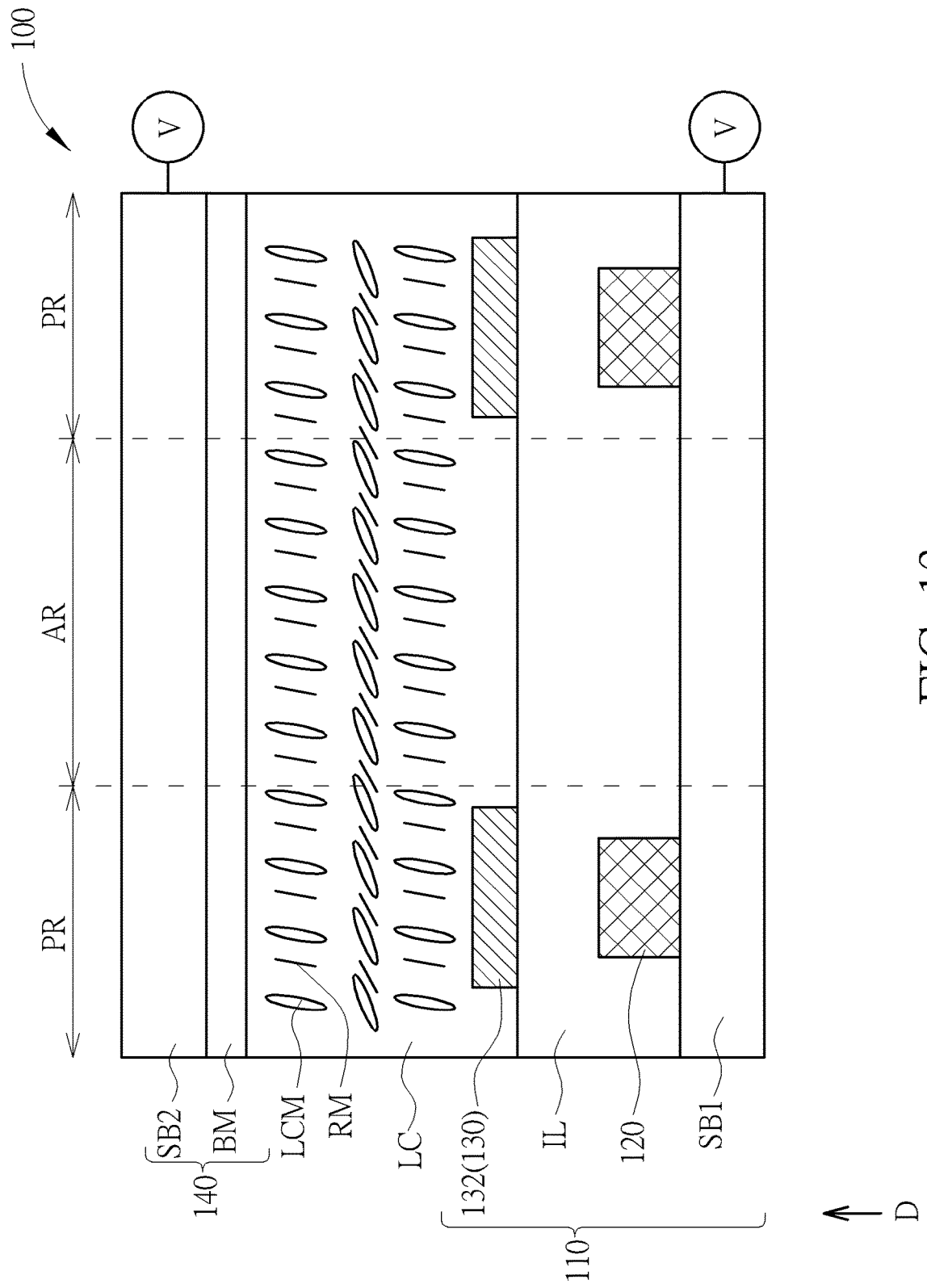

As shown in FIG. 13, FIG. 14 and FIG. 16, the first aligning process is performed (step 1030). In the first aligning process, a voltage V is applied to the array substrate 110 to make the liquid crystal molecules LCM of the liquid crystal layer LC tilt to the predetermined direction and have the pre-tilt angle (step 1030a, as shown in FIG. 13). In this embodiment, the voltages V may be applied to the array substrate 110 and the opposite substrate 140 (the voltages V may be the same or different); for instance, the voltages are applied to the electronic components of the array substrate 110 (e.g. the pixel electrodes in the display region AR) and the common electrode of the opposite substrate 140. Next, the light UV for aligning is irradiated onto the liquid crystal layer LC while applying the voltage V, so that at least a portion of the reactive monomers RM are reacted to fix the pre-tilt angle and the aligning direction of the liquid crystal molecules LCM adjacent to the surface of the opposite substrate 140 or the surface of the array substrate 110 (the surfaces of the organic alignment material layers) (step 1030b, as shown in FIG. 14). Therefore, after removing the voltage, the liquid crystal molecules LCM adjacent to the surfaces of the substrates (the surfaces of the organic alignment material layers) may maintain the fixing of the pre-tilt angle and the fixing of the aligning direction. In detail, the reactive monomers RM reacted by irradiating the light UV may be cross-linked with the organic alignment material layers on the surfaces of the substrates and then be cured, thereby forming the alignment layers AL. In this embodiment, the irradiated light UV is the UV light (the wavelength ranging from 254 nm to 400 nm), and irradiates from bottom to top in FIG. 14, but the present disclosure is not limited thereto. In another embodiment, the light UV may irradiate from top to bottom. If all of the reactive monomers RM are reacted in the first aligning process, the display device 100 shown in FIG. 15 may be formed. Moreover, if the reactive monomers RM are not reacted completely in the first aligning process, a second aligning process may be performed, such that the light UV continuously irradiates the liquid crystal layer LC to complete the reaction of the remaining reactive monomers and make the total reaction volume approach saturation (step 1040). Thus, the display device 100 shown in FIG. 15 is formed. Moreover, before performing the first aligning process, a cutting process may be performed selectively. The cutting process exposes a portion of bonding pads of the display device 100, such that the voltage V may be conducted to the electronic components of the array substrate 110 or the common electrode of the opposite substrate 140 through these bonding pads by a pin contact method. In addition, since the semiconductor layer SM of the electrostatic protecting component 120 of this embodiment may be shielded by the shielding layer 130, the gate electrode, the source electrode and the drain electrode (as shown in FIG. 4), the light intensity that the light UV irradiates the semiconductor layer SM is less than the light intensity that the light UV irradiates the liquid crystal layer LC in the first aligning process and the second aligning process. Accordingly, the influence of the light UV on the semiconductor layer SM and the electrical characteristic of the electrostatic protecting component 120 are reduced.

In summary, because the shielding layer of the present disclosure overlaps the electrostatic protecting component in the projecting direction of the first substrate, and the shielding layer have the function of blocking the light configured to align, the influence of the light on the electrostatic protecting component is reduced, so as to achieve the predetermined alignment and enhance the display quality of the display device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
an array substrate, comprising:
a substrate having a display region and a peripheral region located outside the display region;
an electrostatic protecting component disposed on the substrate in the peripheral region, the electrostatic protecting component comprising a semiconductor layer; and
a shielding layer disposed on the substrate in the peripheral region, wherein the shielding layer overlaps the semiconductor layer; and
an opposite substrate opposite to the array substrate, wherein the opposite substrate comprises a black matrix, and the shielding layer is disposed between the black matrix and the substrate.

2. The display device of claim 1, wherein the electrostatic protecting component further comprises a gate electrode, and the semiconductor layer is disposed between the shielding layer and the gate electrode.

3. The display device of claim 2, wherein the gate electrode is disposed between the substrate and the semiconductor layer.

4. The display device of claim 2, wherein the shielding layer is disposed between the substrate and the semiconductor layer.

5. The display device of claim 2, wherein the semiconductor layer comprises a first semiconductor layer and a second semiconductor layer, and the first semiconductor layer is electrically insulated from the second semiconductor layer.

6. The display device of claim 5, wherein the shielding layer comprises a first shielding layer and a second shielding layer, the first shielding layer and the second shielding layer are separated from each other, the first shielding layer overlaps the first semiconductor layer, and the second shielding layer overlaps the second semiconductor layer.

7. The display device of claim 5, wherein the gate electrode comprises a first gate and a second gate, the first gate is electrically insulated from the second gate, the first gate is electrically connected to the first semiconductor layer, and the second gate is electrically connected to the second semiconductor layer.

8. The display device of claim 1, further comprising a plurality of electronic components disposed on the substrate in the display region, wherein at least one of the plurality of electronic components is coupled with the electrostatic protecting component.

9. The display device of claim 1, further comprising a plurality of electronic components disposed on the substrate in the peripheral region, wherein at least one of the plurality of electronic components is coupled with the electrostatic protecting component.

10. The display device of claim 1, wherein the shielding layer comprises a material capable of absorbing light with a wavelength ranging from 254 nm to 400 nm.

11. The display device of claim 1, wherein the shielding layer comprises at least one of a photoresist material, an organic material and a metal material.

12. The display device of claim 1, wherein the shielding layer is a multi-layer structure.

13. The display device of claim 1, further comprising a space existing between an edge of the shielding layer and an edge of the semiconductor layer.

14. The display device of claim 1, further comprising a short bar disposed on the substrate in the peripheral region, wherein the short bar is coupled with the electrostatic protecting component.

* * * * *